US007142426B2

United States Patent
Wang et al.

(10) Patent No.: US 7,142,426 B2
(45) Date of Patent: Nov. 28, 2006

(54) HEAT DISSIPATING DEVICE AND METHOD FOR MANUFACTURING IT

(75) Inventors: Gen-Cai Wang, Shenzhen (CN); Di-Qiong Zhao, Shenzhen (CN); Yi-Chyng Fang, Tu-Cheng (TW)

(73) Assignees: Fu Zhun Precision Industry (Shen Zhen) Co., Ltd., Guangdong Province (CN); Foxconn Technology Co., Ltd. (TW)

( * ) Notice: Subject to any disclaimer, the term of this patent is extended or adjusted under 35 U.S.C. 154(b) by 80 days.

(21) Appl. No.: 11/015,984

(22) Filed: Dec. 17, 2004

(65) Prior Publication Data

US 2006/0034058 A1  Feb. 16, 2006

(30) Foreign Application Priority Data

Aug. 13, 2004  (CN)  .................. 2004 1 0051155

(51) Int. Cl.
*H05K 7/20* (2006.01)

(52) U.S. Cl. .................. 361/704; 361/703; 361/710; 248/510; 165/80.3; 257/717; 257/727

(58) Field of Classification Search ............. 361/690, 361/700, 702, 704, 707, 709, 710, 719; 165/80.3, 165/185; 257/706–712, 715–719; 174/16.3; 29/512, 830, 837, 832
See application file for complete search history.

(56) References Cited

U.S. PATENT DOCUMENTS 6,381,836 B1 * 5/2002 Lauruhn et al. .............. 29/831
6,386,274 B1 * 5/2002 Wang et al. ................ 165/80.3
6,552,902 B1 * 4/2003 Cho et al. ................... 361/704
6,947,283 B1 * 9/2005 Hsieh et al. ................. 361/703

FOREIGN PATENT DOCUMENTS

CN  2490699 Y  5/2002
CN  2490703 Y  5/2002

* cited by examiner

*Primary Examiner*—Michael Datskovskiy
(74) *Attorney, Agent, or Firm*—Morris Manning & Martin; Tim Tingkang Xia, Esq.

(57) ABSTRACT

A heat dissipating device includes a heat sink forming a pressing portion thereon and a clip. The heat sink includes a hollow dissipating member and a column-shaped core, and the clip includes an integrally formed body defining a round hole therein. The pressing portion extends beyond the clip and presses the body of the clip on the heat sink. The method for manufacturing the heat dissipating device as above-mentioned includes the following steps: providing a heat sink with a collar formed thereon; providing a clip on the heat sink with the collar extending beyond the clip; having the collar deformed under pressure to form a pressing portion pressing the clip on the heat sink.

14 Claims, 4 Drawing Sheets

HEAT DISSIPATING DEVICE AND METHOD FOR MANUFACTURING IT

TECHNICAL FIELD

The present invention relates to a heat dissipating device and a method for manufacturing it, and particularly to a heat dissipating device for an electronic component and method for manufacturing it.

BACKGROUND

As computer technology blooms, electronic components such as central processing units (CPUs) of computers are made to provide faster operational speed and greater functional capabilities, which results in the CPUs generating a significant amount of heat. It is desirable to dissipate the generated heat quickly, for example, by using a heat sink attached to the CPU in enclosures. Generally, a locking device is required for mounting the heat sink to the CPU.

In the earlier time, a heat sink is mounted to a CPU via bolts which extend through a mounting section of the heat sink to engage with a printed circuit board on which the CPU is mounted. However, using of bolts to install or remove the heat sink is complicated and time-consuming.

Nowadays, a heat sink is often securely placed on a CPU mounted on a socket via a plate-type clamp which comprises a pressing portion crossing through and resting on the heat sink and a pair of locking legs formed at opposite ends of the pressing portion to engage with catches of the socket. Unfortunately, the plate-type clamp which generally has a great width occupies space of the heat sink which is originally desired to form more heat-dissipating fins for the heat sink. The clamp thus obviously reduces the heat dissipating surface area of the heat sink when sacrificing these desired fins and therefore decreases the heat dissipating efficiency of the heat sink. Furthermore, when mounting the plate-type clamp to the heat sink, it is difficult to maintain the clamp exerting a balance force on the heat sink and the plate-type clamp is easy to accidentally move when subject to libration. So the stability between the heat sink and the plate-type clamp is poor, and plate-type clamp is easy to loose.

SUMMARY OF THE INVENTION

Accordingly, an object of the present invention is to provide a heat dissipating device which comprises a heat sink and a clip securely engaged to the heat sink.

Another object of the present invention is to provide a heat dissipating device which has a simple structure.

Another object of the present invention is to provide a method for manufacturing above-mentioned heat dissipating device.

To achieve the above-mentioned objects, a heat dissipating device in accordance with a preferred embodiment of the present invention comprises a heat sink on which a pressing portion is provided and a clip placed on the heat sink. The heat sink comprises a hollow dissipating member and a column-shaped core. The clip comprises an integrally formed body defining a round hole therein. The pressing portion extends beyond the clip and presses the body of the clip on the heat sink. The method for manufacturing the heat dissipating device as above-mentioned comprises the following steps: providing a heat sink with a collar formed thereon; providing a clip on the heat sink with the collar extending beyond the clip; having the collar deformed under pressure to form a pressing portion pressing the clip on the heat sink.

Other objects, advantages and novel features of the present invention will be drawn from the following detailed description of a preferred embodiment of the present invention with attached drawings, in which:

DATAILED DESCRIPTION OF A PREFERRED EMBODIMENT

Figure 1:
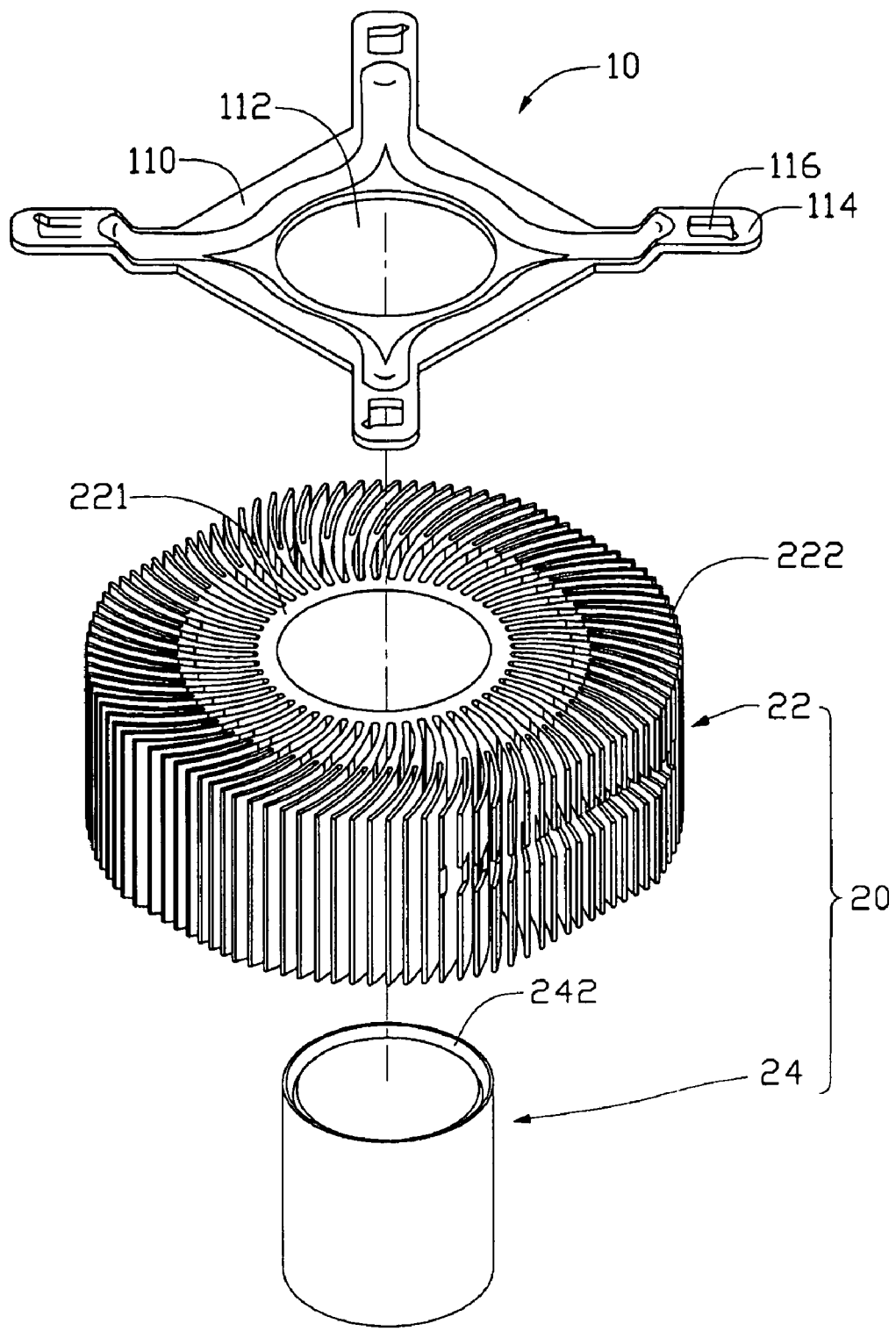
FIG. 1 is an exploded, isometric view of a heat dissipating device in accordance with a preferred embodiment of the present invention.
Figure 2:
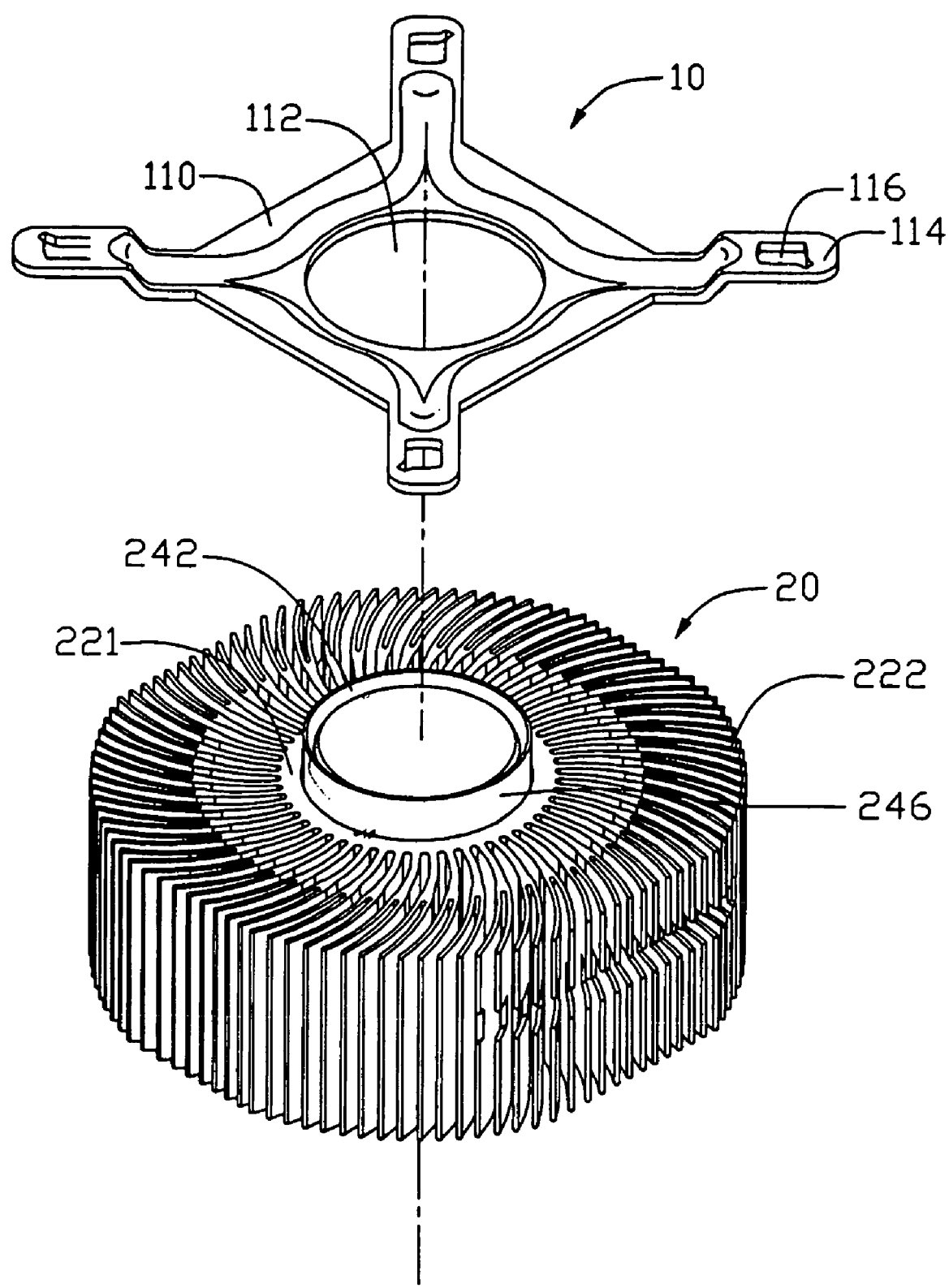
FIGS. 2–4 show a process of assembling the heat dissipating device.

FIG. 1 to FIG. 4 show a heat dissipating device in accordance with a preferred embodiment of the present invention comprising a heat sink 20 and a clip 10.

The clip 10 comprises an integrally formed body 110 defining a round hole 112 therein, and four legs 114 extending from four corners of the body 110 respectively. Each leg 114 defines a bore 116 therein.

The heat sink 20 comprises a hollow dissipating member 22 and a column-shaped core 24 received in the heat dissipating member 22. The dissipating member 22 comprises a tubal portion 221 and a plurality of fins 222 radially extending from an outer circumferential surface of the portion 221. The core 24 has a protrusion formed at one end thereof and exposed outside the heat dissipating member 22. An annular groove 242 is defined in the protrusion by means of lathe or other methods. An outer collar 246 around the groove 242 is therefore formed on the protrusion.

Figure 3:
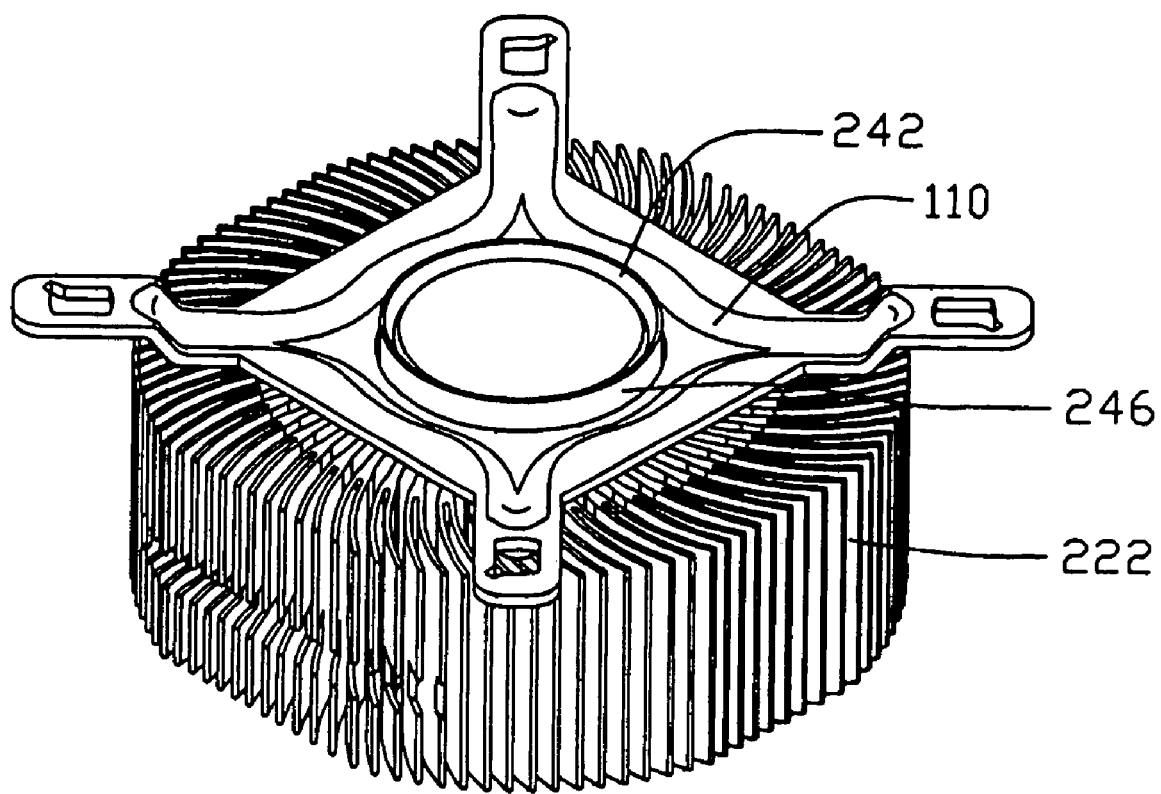
Figure 4:
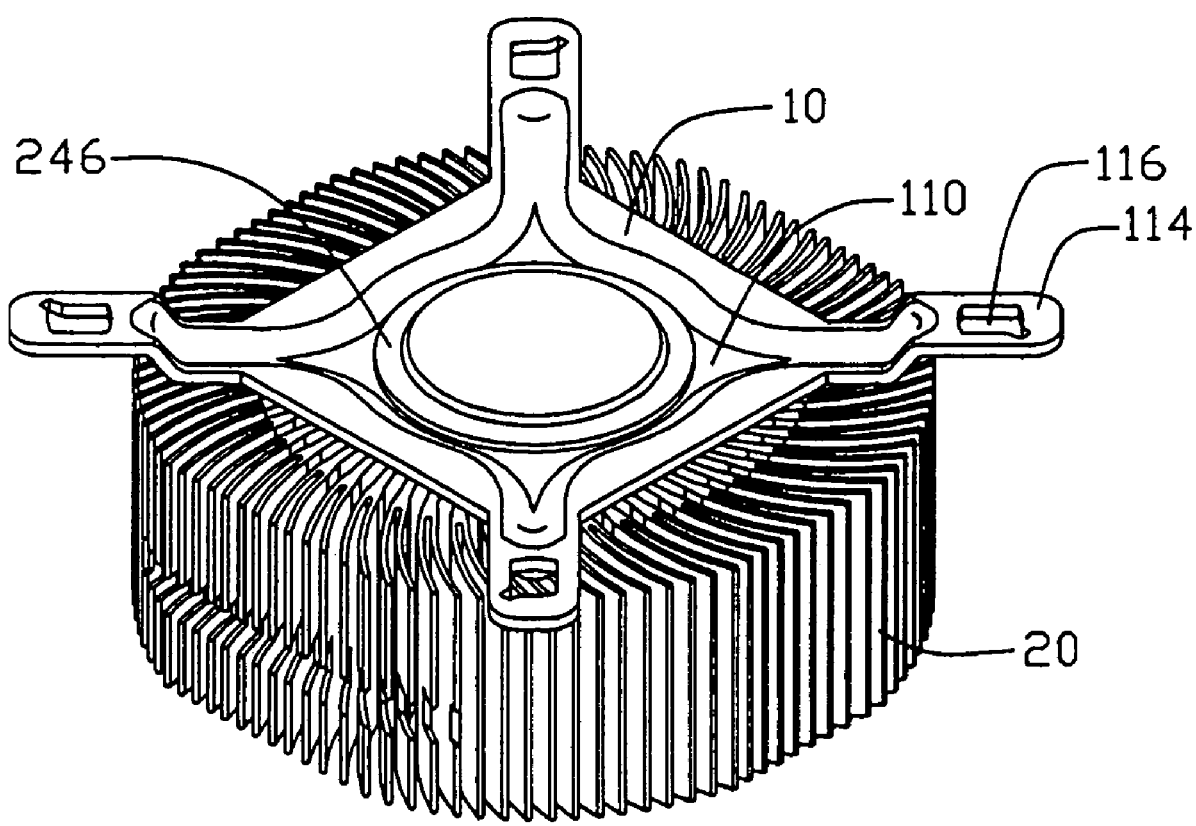

In assembly, the core 24 is inserted through the tubal portion 221 of the dissipating member 22 with the collar 246 exposed at the top end of the dissipating member 22 (see FIG. 3). The clip 10 is placed on the heat sink 20 with the collar 246 of the heat sink 20 extending through the hole 112. The collar 246 is deformed under a pressure to spread outwardly to form a pressing portion cooperating with the heat dissipating member 22 to sandwich the body 110 of the clip 10 therebetween. Thus, the clip 10 is fastened onto the heat sink 20. Moreover, it is understood that the protrusion is formed from one end of the tubal portion 221 of the dissipating member 22.

Alternatively, the heat dissipating member 22 and the core 24 are integrally formed. The collar 246 is integrally formed from the heat sink 20, for fixing the clip 10 to the heat sink 20. The method for it is similar to the one of the preferred embodiment of the present invention.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A heat dissipating device comprising:
   a heat sink with a pressing portion extending therefrom; and
   a clip placed on the heat sink, the clip comprising a body and a plurality of legs extending radially outwardly from the body;
   wherein the pressing portion extends beyond the clip and presses the body of the clip on the heat sink.

2. The heat dissipating device as claimed in claim 1, wherein the body of the clip defines a hole and the pressing portion extends through the hole.

3. The heat dissipating device as claimed in claim 2, wherein said pressing portion is provided at one end of said heat sink.

4. The heat dissipating device as claimed in claim 3, wherein the heat sink comprises a column heat dissipating member and a core received in the heat dissipating member, wherein an end of the core extends beyond one end of the heat dissipating member to form said pressing portion.

5. A heat dissipating device comprising:
   a heat sink comprising a heat dissipating member and a pressing portion extending beyond the heat dissipating member; and
   a clip sandwiched between the heat dissipating member and the pressing portion;
   wherein the heat sink further comprises a core received in the heat dissipating member, the pressing portion extending from one of the heat dissipating member and the core.

6. A method for manufacturing a heat dissipating device comprising the steps of:
   providing a heat sink with a collar formed thereon;
   providing a clip on the heat sink with the collar extending through the clip;
   deforming the collar to prevent the clip from being detachable away from the heat sink.

7. The method as claimed in claim 6, further comprising the step of installing a core of the heat sink into a column heat dissipating member of the heat sink.

8. The method as claimed in claim 7, wherein the core defines an annular groove at one end thereof and the collar is formed at said end of the core surrounding the annular groove.

9. The method as claimed in claim 8, wherein said annular groove is formed by means of lathe.

10. The method as claimed in claim 6, wherein said collar is formed at one end of the heat sink via lathe, and an annular groove is defined in said end of the heat sink and surrounded by the collar.

11. The method as claimed in claim 6, wherein the collar is deformed under pressure to spread outwardly to form a pressing portion cooperating with the heat sink to sandwich the clip therebetween.

12. The heat dissipating device as claimed in claim 1, wherein each of the legs has a hole formed at a free end thereof for mounting purpose.

13. The heat dissipating device as claimed in claim 5, wherein the clip further comprises a plurality of legs extending radially outwardly from the body.

14. The heat dissipating device as claimed in claim 13, wherein each of the legs has a hole formed at a free end thereof for mounting purpose.

* * * * *